(12) United States Patent
Happ et al.

(10) Patent No.: US 7,787,279 B2
(45) Date of Patent: Aug. 31, 2010

(54) INTEGRATED CIRCUIT HAVING A RESISTIVE MEMORY

(75) Inventors: Thomas D. Happ, Tarrytown, NY (US); Cay-Uwe Pinnow, Munich (DE); Ralf Symanczyk, Munich (DE); Klaus-Dieter Ufert, Unterschleissheim (DE)

(73) Assignee: Qimonda AG, Munich (DE)

( * ) Notice: Subject to any disclaimer, the term of this patent is extended or adjusted under 35 U.S.C. 154(b) by 866 days.

(21) Appl. No.: 11/441,805

(22) Filed: May 26, 2006

(65) Prior Publication Data

US 2006/0291268 A1     Dec. 28, 2006

Related U.S. Application Data

(63) Continuation of application No. PCT/DE2004/002620, filed on Nov. 25, 2004.

(30) Foreign Application Priority Data

Nov. 28, 2003   (DE)  ................................ 103 56 285

(51) Int. Cl.
    *G11C 11/00*   (2006.01)
(52) U.S. Cl. ............................. 365/148; 365/163; 257/3
(58) Field of Classification Search ................ 365/148, 365/158, 159, 163; 257/2, 3, 5, E29.07, E29.071, 257/E45.002, E45.003
    See application file for complete search history.

(56) References Cited

U.S. PATENT DOCUMENTS 3,401,318 A    9/1968   Jensen (Continued)

FOREIGN PATENT DOCUMENTS

EP          1 355 365 A2    10/2003

(Continued)

OTHER PUBLICATIONS

Fernandes, A., et al., "Memory Characteristics of Si Quantum Dot Devices with $SiO_2$/ALD $Al_2O_3$ Tunneling Dielectrics," International Electron Devices Meeting, 2001 IEDM Technical Digest, Dec. 2-5, 2001, pp. 7.4.1-7.4.4.
Hwang,Y.N., et al., "Completely CMOS-Compatible Phase-Change Nonvolatile RAM Using NMOS Cell Transistors," $19^{th}$ IEEE Non-Volatile Semiconductor Memory Workshop, Monterey, CA, Feb. 16-20, 2003, pp. 91-92.
Ali, H.A., et al., "Properties of self-assembled ZnO nanostructures," Solid-State Electronics 46 (2002), pp. 1639-1642.
Wicker, Guy, "Nonvolatile, High Density, High Performance Phase Change Memory," Part of the SPIE Conference on Electronics and Structures for MEMS, Australia, Oct. 1999, SPIE vol. 3891, pp. 2-9.

*Primary Examiner*—J. H. Hur
(74) *Attorney, Agent, or Firm*—Dicke, Billig & Czaja, PLLC (57) ABSTRACT

An integrated semiconductor memory includes a storage medium (6) arranged between two electrodes (10, 20), which storage medium may be a phase change medium, for example. The storage medium (6) can be put into a first state or a second state by means of an electric current, as a result of which an item of information can be stored. According to embodiments of the invention, a layer plane (L) is provided in which impurity particles made from a material (4) are embedded, as a result of which the current density in the storage medium is locally increased and the programming current required for reprogramming is reduced. As a result, the current consumption of memory elements containing a phase change medium is reduced, so that for the first time they can be embodied with minimal feature size, together with other components such as transistors, and integrated into a single semiconductor circuit and no longer have to be arranged in separate subcircuits.

13 Claims, 4 Drawing Sheets

U.S. PATENT DOCUMENTS

| | | |
|---|---|---|
| 6,150,253 A | 11/2000 | Doan et al. |
| 6,534,326 B1 | 3/2003 | Hsu et al. |
| 6,579,760 B1 | 6/2003 | Lung |
| 2001/0018132 A1 | 8/2001 | Hartner et al. |
| 2003/0049912 A1 | 3/2003 | Campbell et al. |
| 2003/0209971 A1* | 11/2003 | Kozicki ................... 313/498 |
| 2005/0029502 A1* | 2/2005 | Hudgens ................... 257/4 |
| 2006/0097238 A1 | 5/2006 | Breuil et al. |

FOREIGN PATENT DOCUMENTS

| | | |
|---|---|---|
| KR | 1020010030474 | 4/2001 |
| KR | 20020022630 | 3/2002 |
| KR | 1020030057420 A | 7/2003 |
| KR | 1020030079743 A | 10/2003 |
| KR | 1020030079811 A | 10/2003 |
| WO | WO 03/079463 A2 | 9/2003 |
| WO | WO 2004/017436 A2 | 2/2004 |

* cited by examiner

INTEGRATED CIRCUIT HAVING A RESISTIVE MEMORY

This application is a continuation of co-pending International Application No. PCT/DE2004/002620, filed Nov. 25, 2004, which designated the United States and was not published in English, and which is based on German Application No. 103 56 285.0 filed Nov. 28, 2003, both of which applications are incorporated herein by reference.

TECHNICAL FIELD

The invention relates to an integrated semiconductor memory and to a method for producing an integrated semiconductor memory.

BACKGROUND

In semiconductor fabrication, semiconductor memories are produced that have a multiplicity of memory cells arranged in a memory cell array. A distinction is made between volatile and nonvolatile semiconductor memories. Nonvolatile semiconductor memories, which store stored information items even after the voltage supply has been turned off, may be formed as phase change memories. Phase change memories have a storage medium, which can assume two different states of different levels of electrical conductivity and undergoes a phase transition between these two states. The different conductivity of the storage medium can be utilized in phase change memories in order to store digital information items. By way of example, a layer made from a phase change medium is arranged between two electrodes to which an external voltage is applied. On the basis of the magnitude of the current flow through the electrodes and the phase change medium, it is possible to determine the state of matter of the phase change medium. Furthermore, by means of higher currents, which heat the phase change medium to higher temperatures above the crystallization temperature or melting point, the state of the storage medium can be altered and a digital information item can thus be overwritten.

Furthermore, further concepts exist for storage media that, on account of other properties, for example magnetic properties or their ferroelectric polarizability, can assume different states in which the respective electrical conductivity of the storage medium differs to an extent that suffices to represent two different digital information items.

In an integrated semiconductor circuit, the memory state of an individual memory cell can only be altered electrically, that is to say by a current flowing through the storage medium or in the vicinity thereof, or by a voltage applied to the storage medium. The higher the current required for changing the state of the storage medium and thus for rewriting the digital information, the higher the energy consumption of the integrated semiconductor memory. Particularly in the case of phase change media and other storage media whose state is dependent on temperature, the currents for heating to the phase transition temperatures or melting points require a considerable amount of energy.

The temperature increases required for programming the memory cells can only be achieved by high programming currents. Memory components comprising a phase change medium, which requires these high programming currents, cannot readily be integrated together with other components such as selection transistors into a single semiconductor circuit if the other components are intended to be dimensioned according to the smallest possible feature size. In present-day memory circuits, permissible maximum currents of CMOS transistors are approximately 0.5 mA per micrometer of channel width.

Moreover, there is the problem that in the case of high currents for rewriting a digital information item, only very few memory cells can be overwritten simultaneously without exceeding the maximum permissible current density in partial regions of the semiconductor circuit. Therefore, the programming currents that are still very high at present restrict the degree of parallelism of memory operation.

SUMMARY OF THE INVENTION

The object of the present invention is to provide an integrated semiconductor memory that requires lower currents for reprogramming digital information items than conventional semiconductor memories and into which memory elements having a storage medium of the type mentioned in the introduction are integrated, in a manner embodied with minimal feature size, together with other components such as transistors, for example, and no longer have to be arranged in separate subcircuits or embodied with greater feature size. Moreover, the semiconductor memory is intended to be able to simultaneously overwrite a relatively large number of digital information items without exceeding the maximum permissible current intensity in the semiconductor memory. Furthermore, the intention is to specify methods for producing such a semiconductor memory.

This object is achieved according to the invention by means of an integrated semiconductor memory comprising a memory cell having a storage layer comprising a storage medium, which can assume a first state of lower electrical conductivity and a second state of higher electrical conductivity and which undergoes a phase transition between the first and second states, it being possible to set the respective state of the storage medium with the aid of an electric current flowing through the storage medium, the storage layer having a layer plane in which regions made from a different material than the storage medium are distributed and in which the storage medium is arranged between the regions made from the different material, the regions made from the different material having dimensions that are smaller than a feature size that can be dimensioned lithographically, and the different material adjoining patterned regions of an electrically insulating layer.

The feature size that can be dimensioned lithographically may be, for example, the feature size of an electrode adjoining the storage layer, or the feature size of the patterned storage layer. The regions made from the different material than the storage medium may be spatially isolated islands or form a contiguous perforated layer having a multiplicity of openings. By way of example, either the perforated layer may be formed by the material and the isolated islands by the storage medium or the perforated layer may be formed by the storage medium and the isolated islands by the material. Furthermore, the regions made from the different material may concomitantly comprise patterned regions of a patterned electrically insulating layer or consist exclusively of the regions.

The invention provides an integrated semiconductor memory that has a layer, that is to say a technological layer plane, in which the storage medium and a material are sublithographically distributed so finely that, at the level of this layer or layer plane, only a certain fraction of the basic area of the layer plane is covered with the storage medium. Whereas the storage medium is always present as a compact layer in the case of a conventional semiconductor memory, the storage medium in the case of the layer plane provided according to the invention constitutes a porous filling, for example, the pores of which are filled by isolated particles of the material. Conversely, given a smaller volume and area proportion of the storage medium, the storage medium may be introduced in the form of a multiplicity of microscopic small fillings in pores of a perforated, essentially contiguous layer made from the material. It is likewise conceivable for the storage medium and the material to be provided in approximately identical proportions in the layer plane and to be grown together in each case partially to form a crosslinked structure, the two crosslinked structures made from the material and made from the storage medium overall constituting a compact layer.

Above and/or below this layer or layer plane, the storage medium may be provided in conventional fashion in a compact form without cutouts or impurity fillings. The material layer provided according to the invention and comprising the incorporated fillings made from material has the effect, in the case of the integrated semiconductor memory mentioned in the introduction, that currents which flow through the storage medium, at the level of the material plane with the incorporated impurity fillings made from a different material, are divided into many partial currents that flow through between the electrically insulating regions and have there, in each case, a higher current density than the average current density in a compact storage medium formed without impurity fillings. Therefore, at the level of the layer plane, the current density is increased at a multiplicity of microscopically small regions, as a result of which, at the same time, the temperature rises to a greater extent in these regions than in a compact layer made from the storage medium. This has the effect that, by means of comparatively low currents, much greater temperature increases can be obtained than in a layer made from a compact storage medium, which has no impurity particles or fillings made from the different material. At the level of the material layer provided herewith, the current flowing overall through the cross section of the basic area of a storage layer is conducted through a fraction of the basic area, as a result of which the current density rises by an inversely proportional factor. Depending on the degree of coverage of the area region with isolated islands or with a perforated, crosslinked layer made from the material, the current density in the remaining region of the basic area that is filled with the storage medium can be increased by several orders of magnitude. As a result, with a reduced total current, it is possible to achieve a temperature increase that is identical in magnitude or an even greater temperature increase. The storage medium is heated to the greatest extent at the level of the layer provided with the material. By means of the lower currents that are required in the semiconductor memory according to the invention for reprogramming the memory cells, memory components comprising storage media such as phase change media, for example, can be jointly integrated together with components such as transistors or diodes, which can be electrically and thermally loaded only to a limited extent into an integrated semiconductor circuit without the rest of the components such as selection transistors, for instance being given artificially larger dimensioning than according to the smallest possible feature size. Moreover, it is possible for a relatively large number of memory cells to be programmed simultaneously without the risk of damaging such structures. By means of the impurity material introduced into the storage medium according to the invention, the volume of the storage medium whose state has to be altered for programming is reduced, as a result of which the energy consumption is reduced.

According to the invention, provision is made, finally, for the different material to adjoin patterned regions of an electrically insulating layer. The patterned regions of the layer may be provided on one side of the layer plane, for example below it. The material, which, depending on the degree of coverage of the basic area of the storage layer, is deposited in the form of isolated islands or in the form of a perforated layer crosslinked to a greater or lesser extent, can simultaneously be used as an etching mask during the production of the semiconductor memory, so that the electrically insulating layer is removed below interspaces between the material serving as an etching mask and patterned regions of the electrically insulating layer remain below the material itself. The material that serves as an etching mask, and that may be electrically conductive, semiconducting or else insulating or dielectric, can be removed again after the electrically insulating layer has been patterned.

It is preferably provided that the layer plane is surrounded by the storage medium on both sides. The layer plane may be arranged at an arbitrary level within a layer sequence having two partial layers of the storage medium.

It may be provided that the different material is arranged directly on an interface with a carrier layer. The carrier layer may be an electrode layer, for example. As an alternative to this, it may be an insulation layer made from an insulator, as a result of which the current paths having an increased current density are lengthened.

It is preferably provided that the storage medium is electrically conductively connected to a first electrode and to a second electrode.

With regard to the degree of coverage, it is preferably provided that an area proportion of the interface with the carrier layer of between 0.01 and 90% is covered by the storage medium. In particular, it is provided that an area proportion of the interface of between 0.01 and 5% is covered by the storage medium. Primarily very small degrees of coverage of, for example, less than 1 or 0.5% lead to a considerable increase in the current densities obtained in the layer plane, since the entire current has to flow through a correspondingly small percentage of the available basic area.

It is preferably provided that the regions made from the different material are isolated islands having an average size of between 0.5 and 100 nm. The isolated islands may be formed from the material. If the storage medium within the layer plane is formed only in the form of isolated islands or channels, the channels are conductively connected to one another above the layer plane by a compact and gap-free layer of the storage medium that is contiguous there.

The material is preferably formed from nanocrystalline particles or from an amorphous insulator.

With regard to the storage medium, one preferred embodiment provides for the storage medium to have a lower degree of crystallization in the first state and a higher degree of crystallization in the second state.

By way of example, the storage medium may be predominantly amorphous in the first state and predominantly crystalline, polycrystalline or nanocrystalline in the second state. The storage medium may preferably be a phase change medium.

The storage medium may furthermore be a chalcogenide or a pnicogenide; it may contain in particular compounds of one of the elements germanium, antimony, tellurium, silver, indium, vanadium or compounds with a plurality of these elements.

It is preferably provided that the storage medium and the material are arranged between the first electrode and the second electrode and an electric current flowing through the storage medium can be fed with the aid of the electrodes. In this case, a current flows, for example, from an electrode adjoining the layer plane or a first partial layer made from compact storage medium through the layer plane and through the storage medium as far as the second electrode, or in the opposite direction. Depending on the degree of coverage of the basic area or a corresponding layer plane with the material, the current density is locally increased there to a multiple at many microscopically small regions. The greater the degree of coverage by the material or by the electrically insulating layer patterned herewith, the greater the current density in the regions not covered by the material, that is to say in the storage medium within the layer plane.

It is preferably provided that the semiconductor memory is a nonvolatile phase change memory.

The object on which the invention is based is furthermore achieved by means of a method for producing an integrated semiconductor memory. A first electrode is formed and a material is deposited in such a way as to form a multiplicity of regions made from the material. The regions have smaller dimensions than feature sizes that can be produced lithographically. The deposition ends before the material grows together to form an uninterrupted layer having no gaps. A storage medium, which can assume a first state of lower electrical conductivity and a second state of higher electrical conductivity and which undergoes a phase transition between the first and second states, is deposited. A second electrode is formed on or at the storage medium.

The object is furthermore achieved by means of an alternative method in which the order of the second and third method steps is interchanged.

In the case of the methods according to the invention, the material is deposited before and respectively after the deposition of the storage medium, to be precise in such a way that, rather than a contiguous layer having no gaps arising at the very beginning of the growth, firstly isolated particles or growth seeds arise which, if the growth is continued for long enough, are also permitted to grow together to form a layer that is crosslinked to a greater or lesser extent but under no circumstances has no gaps. For this purpose, the process implementation of the growth process is controlled such that the growth behavior corresponds either to Stranski-Krastanov growth or Vollmer-Weber growth. In the case of Stranski-Krastanov growth firstly a monolayer arises, but this is removed again by means of an etching-back. As a result of the deposition of the storage medium onto the multiplicity of isolated islands made from the material or onto the partially crosslinked layer made from the material and provided with gaps or openings, the degree of coverage of the basic area of the storage layer with the storage medium is reduced to a fraction at the level of the layer plane and the current density arising during operation of the semiconductor memory is multiplied in the formed channels or regions made from the storage medium.

It is preferably provided that the storage medium is deposited both prior to the deposition of the material and after the deposition of the material. The layer plane with the storage medium and the different material may be arranged at an arbitrary level within a layer sequence having two partial layers made from compact storage medium.

It is preferably provided that the deposition of the material is ended before spatially isolated islands made from the material grow together to form a perforated layer. As an alternative to this, it is provided that the deposition of the material is continued until spatially isolated islands made from the material grow together to form a perforated layer. The second variant is preferred in order to obtain particularly high current densities, whereas a risk of a non-closed electrical contact between the storage layer and the bottom electrode is lower in the case of the first variant than in the case of the second variant.

One development of the invention provides for an electrically insulating layer to be deposited prior to the deposition of the material, and for the electrically insulating layer to be etched after the deposition of the material using the material as an etching mask. In this case, it increases the depth of the regions filled with material and lengthens the channels having a high current density between the bottom electrode and the compact layer that is arranged above the layer plane and consists exclusively of the storage medium. As a result, a greater proportion of the entire storage medium is exposed to the higher current density than without micro- or nanostructures made from the material.

Regions in which the electrically insulating layer was etched are filled with the storage medium during the deposition of the storage medium. The electrical contact between the bottom electrode and the storage medium is thereby produced.

The deposition of the material and of the storage medium results in the production of a layer, that is to say a layer plane comprising a perforated layer, having openings that are smaller than a feature size that can be dimensioned lithographically, for example smaller than a lithographic feature size used for patterning the electrodes or the storage layer. In general, the insulating structures are even far more finely grained; the size relationship with respect to the feature size that is usually used lithographically may amount to as little as one hundredth or even as little as one ten thousandth and enables nano- or micropatterning that is not achievable lithographically. The required temperature or the current intensity to be used can be adapted depending on the degree of coverage of the storage layer basic area with the regions made from the material.

It is preferably provided that a storage medium is deposited that has a lower degree of crystallization in the first state and a higher degree of crystallization in the second state. The storage medium may for example be predominantly amorphous in the first state and predominantly crystalline, polycrystalline or nanocrystalline in the second state.

DESCRIPTION OF THE DRAWINGS

The invention is described below with reference to FIGS. 1 to 12, in which.

The following list of reference symbols can be used in conjunction with the figures:
1 Semiconductor memory
2 Memory cell
3 Substrate
4 Material
5 Contact connection
6 Storage medium
6a Crystalline region
6b Matrix
10 First electrode
11 Electrode layer
12 Etch of the electrically insulating layer
13 Interconnect
14 Isolated island
15 Electrically insulating layer
16 Contiguous perforated layer
17 Interspace between isolated islands
18 Lithographic feature size
20 Second electrode
25 Interface surface
A, B States of the storage medium
G Basic area
J Increased current density
$J_1$, $J_2$ Programming currents
L Layer plane
PCM Phase change medium
S Storage layer

DETAILED DESCRIPTION OF ILLUSTRATIVE EMBODIMENTS

Figure 1:
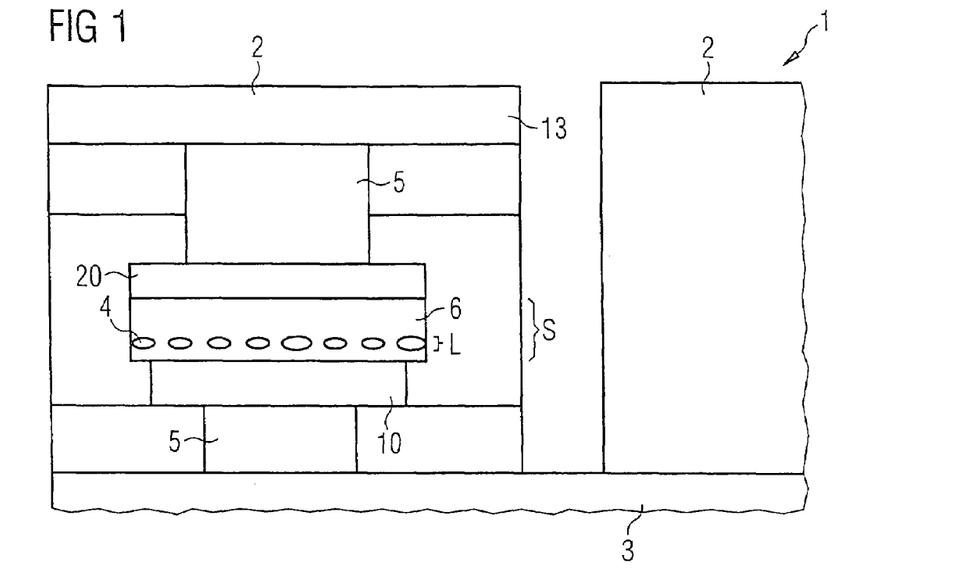
FIG. 1 shows a semiconductor memory according to the invention.

FIG. 1 shows a schematic cross-sectional view of a semiconductor memory 1 according to an embodiment of the invention, in which a memory cell 2, which is representative of the rest of the memory cells, has a first electrode 10, a second electrode 20 and a storage medium 6 in between. The electrodes 10, 20 are connected by contact connections 5 to corresponding interconnects or to the substrate 3 and an interconnect 13 situated at a higher level. In the lateral direction, the memory cell is shielded from adjacent memory cells by corresponding insulations.

According to embodiments of the invention, within the storage medium 6 provision is made of a layer or layer plane in which impurity particles made from a material 4 are incorporated, as a result of which, at the level of the layer plane, that proportion of the basic area of the storage layer situated between the electrodes 10, 20, which is covered with the storage medium 6 is reduced to a fraction or in any event to a part of the total basic area.

Figure 2:
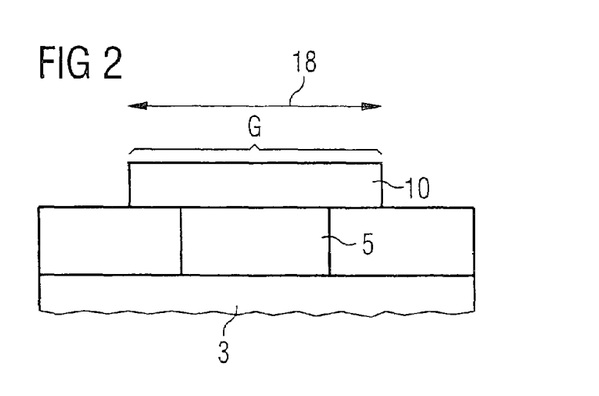
FIGS. 2 to 8 show various method steps of a production method according to the invention for producing the semiconductor memory from FIG. 1.

According to an embodiment of the invention, the storage layer S having a layer plane L in which regions made from a different material 4 than the storage medium 6 are distributed and in which the storage medium 6 is arranged between the regions made from the different material 4, the regions made from the different material 4 having dimensions that are smaller than a feature size 18 that can be dimensioned lithographically (FIG. 2), and for example than the feature size of the storage layer S or one of the electrodes 10, 20. Furthermore, the regions made from the different material 4 may concomitantly comprise patterned regions of a patterned electrically insulating layer 15 (e.g., FIG. 3) or consist exclusively of the regions.

According to an embodiment of the invention, as a result, at the level of the layer plane L, increased current densities are constrained in the storage medium between mutually adjacent regions made from the insulating material. These current densities heat the storage medium there to a greater extent than in the case of a storage layer that consists exclusively of a homogeneous storage medium. The phase transition that has already occurred at a lower total current continues from the layer plane L through the rest of the material of the storage medium 6 and changes the state of the storage medium with a lower total current. As a result, the memory cell is reprogrammed with a lower energy consumption.

FIGS. 2 to 8 show the semiconductor memory produced in this way in various method steps of a method according to embodiments of the invention. In accordance with FIG. 2, a first, bottom electrode 10 is applied to a semiconductor substrate 3, which is not itself specifically illustrated in FIGS. 3 to 8, the basic area G of the bottom electrode 10 being patterned lithographically. The basic area G of the electrode 10 has the feature size 18. The electrode 10 may for example be electrically connected to the substrate 3 with the aid of a contact connection 5 or be connected to adjacent structures by means of the contact connection 5.

Figure 3:
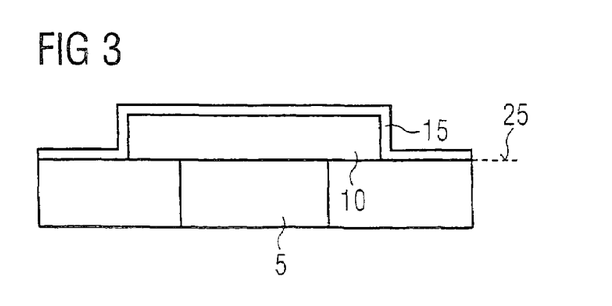

An electrically insulating layer 15 may optionally be applied to the first electrode 10, as illustrated in FIG. 3. The electrically insulating layer 15 is a layer to be patterned which, in patterned form, serves for lengthening channels having an increased current density and thus for exposing a larger proportion of the storage medium 6 to the increased current density. In this case, the material 4 is grown onto the surface of the electrically insulating layer 15 and subsequently used as an etching mask for the patterning of the insulating layer 15. The material 4 may subsequently be removed again. These steps are illustrated in the subsequent figures.

Figure 4:
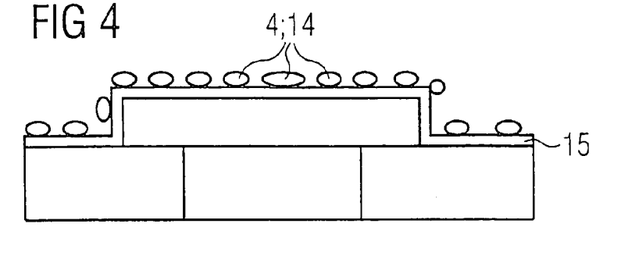

In accordance with FIG. 4, a material 4 is applied to the electrically insulating layer 15 instead of to the electrode 10. The material must be applied such that isolated islands 14 made from the material 4 arise, which are spatially separated from one another, that is to say isolated, and only in the course of progressive growth gradually grow together to form a crosslinked layer that is initially provided with gaps.

Figure 5:
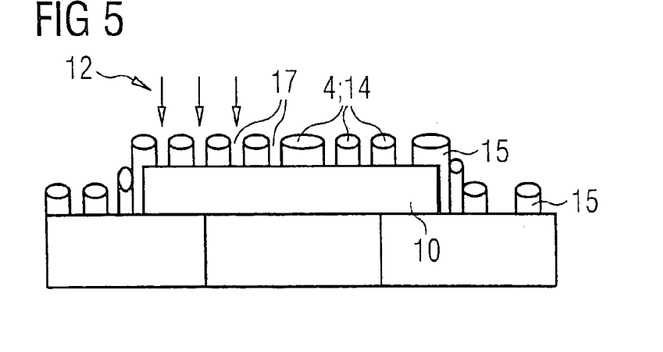

In accordance with FIG. 5, an anisotropic etch is performed, as represented by the arrows 12, as a result of which the insulation layer 15 is etched in interspaces between the particles 14 made from the material 4. If the electrically insulating layer 15 comprises an insulating material, for example silicon dioxide, the height of electrically insulating regions on the first electrode 10 is increased as a result of its patterning. As a result, longer current channels having an increased current density are generated during operation of the semiconductor memory.

Figure 6:
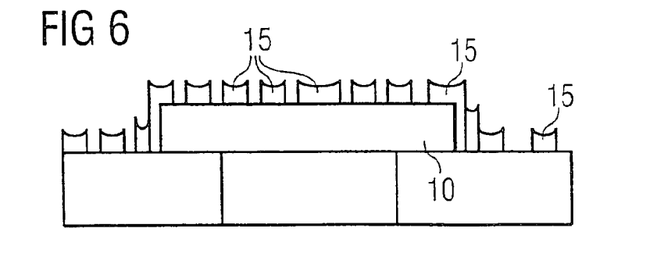

In accordance with FIG. 6, the material 4 that was used as an etching mask for the electrically insulating layer 15 in FIG. 5 can be removed again. This is advantageous in particular if the material 4 is electrically conductive or not sufficiently thermally stable to withstand the supply of heat arising during repeated reprogramming. However, it can equally remain on the patterned layer 15, as illustrated in the following figures.

Figure 7:
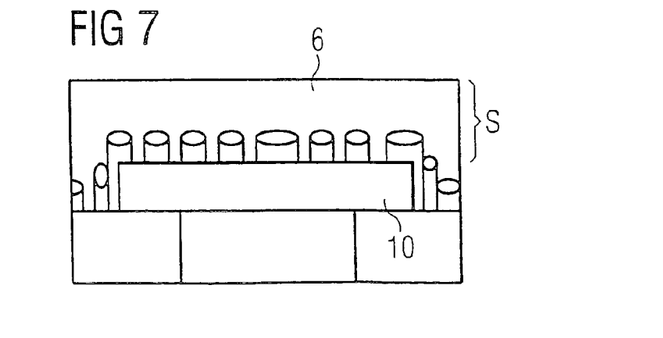
Figure 8:
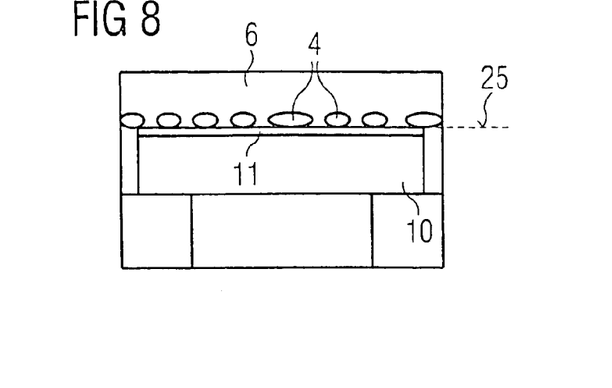

In accordance with FIG. 7, the storage medium 6, which is preferably a phase change medium, is deposited onto the regions made from the insulating material 4 which, depending on the growth duration, are still isolated or have already partially grown together. The storage layer produced in this way may subsequently be patterned, as illustrated in FIG. 8, as a result of which the basic area of the storage layer is essentially adapted to the basic area of the first electrode 10. FIG. 8 simultaneously illustrates an alternative embodiment of the method according to the invention, in which, in a method stage corresponding to FIGS. 3 and 4, the material 4, instead of being applied to an electrically insulating layer 15, has been applied directly to the electrode 10 or to an electrode layer 11 associated with it.

Proceeding from FIG. 8, it is only necessary for the second, top electrode 20 to be applied, patterned and connected via a contact connection 5 to an interconnect 13 in order to obtain the semiconductor memory 1 comprising the memory cell 2 formed according to the embodiment as illustrated in FIG. 1.

In FIGS. 4 to 8, the level of the layer or layer plane L is prescribed by the vertical position of the regions made from insulating material 4.

Figure 9A:
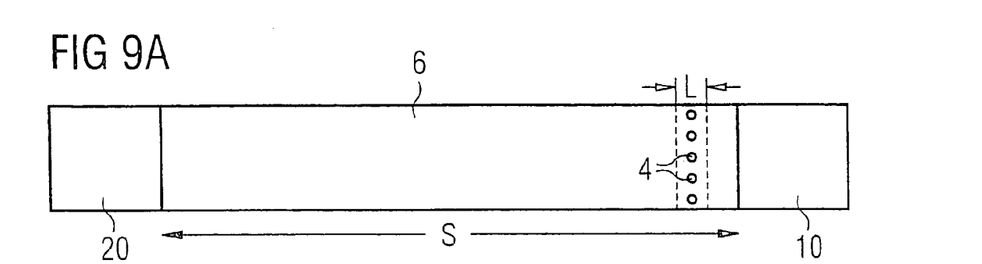
FIGS. 9A and 9B show an enlarged cross section through a layer sequence comprising two electrodes and—arranged in between—a storage medium comprising a layer plane with insulating impurity particles.

FIG. 9A shows a cross section through a layer sequence comprising first electrode 10, storage medium 6 and second electrode 20, in which regions made from a material 4 are present in the storage layer in the region of a layer plane L instead of compact materials of the storage medium 6. At the level of the layer plane L, the storage layer arranged between the electrodes is electrically conductive only over a statistical fraction of its basic area.

Figure 9B:
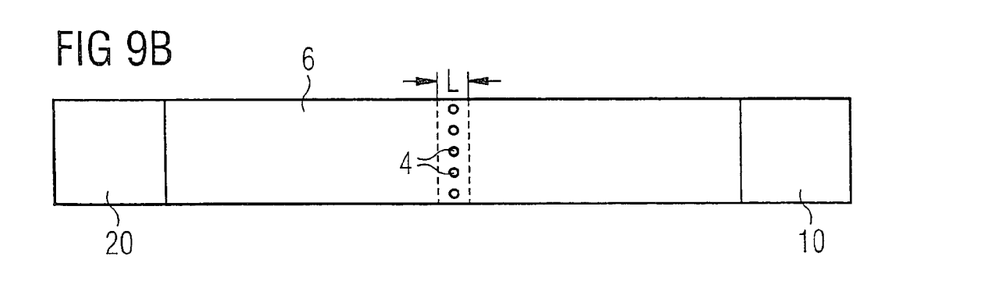

FIG. 9B shows a cross section through the layer sequence between the electrodes 10 and 20, which corresponds to FIG. 9A, the layer plane L being arranged approximately in the center between two partial layers made from compact storage medium in each case. The layer plane may also be arranged in an arbitrary layer positioned between the electrodes 10, 20.

Figure 10:
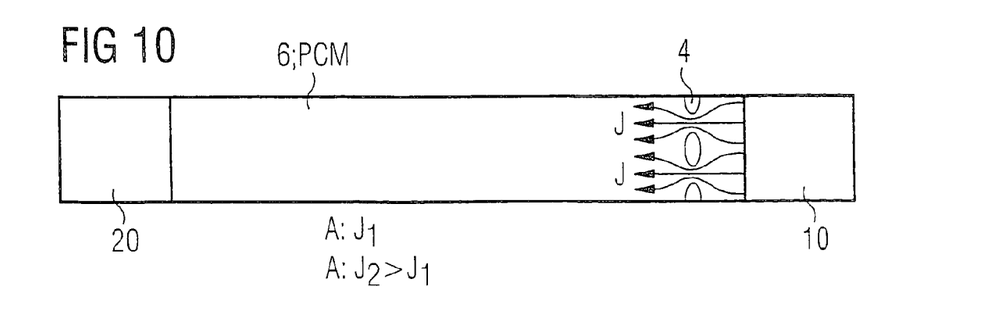
FIG. 10 shows a schematic illustration of current channels and of phases of the storage medium.

FIG. 10 shows a cross section through the layer sequence comprising the electrodes 10, 20 and the storage layer comprising the storage medium 6, which corresponds to FIGS. 9A and 9B, the profile of electric field lines being illustrated on the basis of two interspaces between regions made from the material 4. On the basis of the compression of the field lines between adjacent regions made from the insulating material 4, the current density J is increased compared with that in the solid storage medium 6 formed without any gaps. FIG. 10 shows schematically for two different phases or states of the storage medium 6, namely the phases A and B, that different programming currents $J_1$ and $J_2$ are necessary in order to bring the storage medium into phase A or B. By way of example, state A may be a crystalline state, which is achieved at a temperature of above 300° C. and, therefore, requires a current $J_1$ for programming. In order to obtain an amorphous state B having lower conductivity, it is necessary to employ a current $J_2$, for example, which is greater than the current $J_1$ and which has the effect that the storage medium 6 is partially melted and is cooled, i.e., quenched, to room temperature again within a very short time owing to the metallic electrodes 10, 20 having high thermal conductivity. As a result, the atomic framework of the storage medium 6 remains in an amorphous, disordered state of comparatively lower electrical conductivity in comparison with the crystalline or polycrystalline state A.

Figure 11:
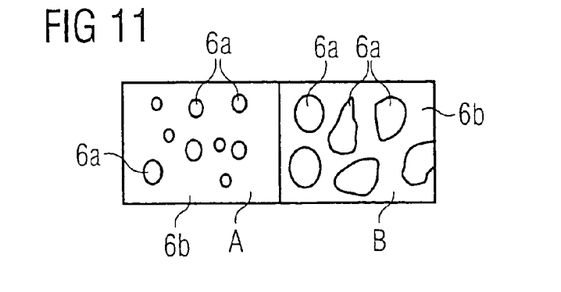
FIG. 11 shows two states of different electrical conductivity of the storage medium.

FIG. 11 shows two states A and B, which the storage medium 6 can assume depending on the temperature. In the first state A, which the storage medium 6 assumes at relatively low temperature, a relatively small proportion of the storage medium 6 is present in the form of crystalline regions 6a. The remaining proportion of the storage medium 6 may be present in the form of an amorphous matrix 6b. In state B, which the storage medium 6 assumes at relatively high temperature, a larger proportion of the storage medium 6 is present in the form of crystalline regions 6a than in state A. By way of example, the storage medium may be predominantly amorphous in state A and predominantly crystalline, polycrystalline or nanocrystalline in state B. States A and B relate to the material properties of the storage medium 6. During operation of the integrated semiconductor memory, however, the storage medium 6 has to undergo a phase transition only in the region of the layer plane L in order to store an item of information.

Figure 13:
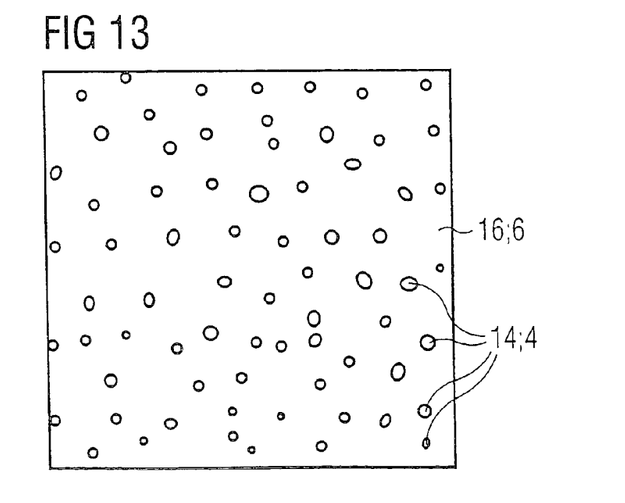
FIG. 13 shows a second, alternative embodiment with regard to the composition of the storage layer at the level of the layer plane.

In accordance with FIG. 13, the storage plane at the level of the layer plane may predominantly comprise the storage medium 6; the latter forms in this case a contiguous, perforated layer 16 in the openings of which is incorporated the material 4 in the form of spatially isolated islands 14. With the comparatively large degree of coverage of the basic area of the storage layer with the storage medium 6, only a small reduction of the programming currents is achieved.

Figure 12:
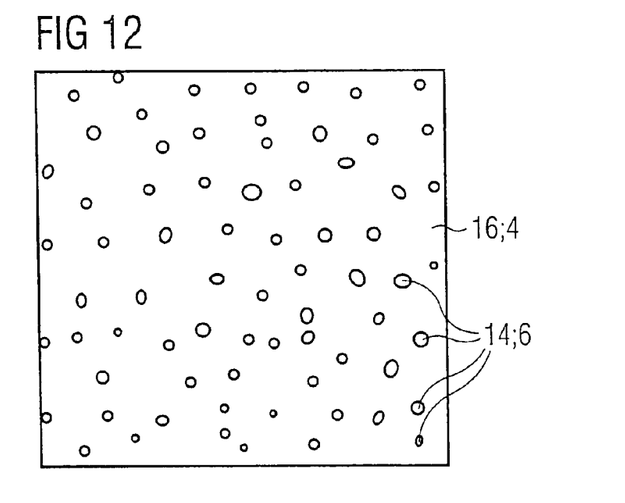
FIG. 12 shows a schematic illustration of the composition of the storage layer at the level of the layer plane.

FIG. 12 illustrates an embodiment in which the material 4 was grown until it forms a crosslinked, contiguous layer 16 which, however, is provided with pores or gaps. In the illustrated horizontal cross section viewed from the plan view, the material of the storage medium 6 is arranged in the form of many isolated islands 14 which form, in the three-dimensional structure, channels running between the first electrode 10 and the bulk material of the storage medium 6 which is arranged nearer to the second electrode 20.

The insulating material 4 may be deposited in the form of crystalline nanoparticles and be used as an etching mask. Suitable deposition methods are for example CVD, PVD, sputtering, the spin-on method, laser ablation or vapor deposition. Atomic layer deposition is furthermore taken into consideration. Afterward, provided that the electrically insulating layer 15 is not additionally patterned beforehand, the storage medium is deposited onto the grown regions made from the material 4, the storage medium preferably being a phase change material, in particular a chalcogenide or pnicogenide. Suitable phase change media are for example compounds made from germanium antimony and tellurium or those that additionally contain silver. The material 4 may also comprise weakly electrically conductive materials, for example made from silicon or other semiconducting materials. What is crucial is that the conductivity is lower in the material 4 than in the material of the storage medium 6. By virtue of the fact that the material 4 is grown either by Stranski-Krastanov growth or by Vollmer-Weber growth, a pattern with a predetermined point density of the grown particles arises. A contiguous area that is formed from many micro- or nanoparticles and is composed of many individual segments arises in the event of growth that lasts for a relatively long time. In the event of relatively short growth times, by contrast, the many individual segments grown remain separated from one another. As an alternative to Stranski-Krastanov growth with subsequent etching-back of the monolayer initially formed and as an alternative to a Vollmer-Weber growth, it is also possible to use self-assembled clusters made from metals or metal oxides, for example, in order to reduce the electrically conductive area regions over the basic area of the storage layer at the level of the layer plane L. Furthermore, it is possible to use any material that is sufficiently thermally stable and is preferably also electrically insulating. Even materials that are not thermally stable may be used as an etching mask for the patterning of an electrically insulating layer if they are removed again afterward.

Furthermore, it is possible to use a microphase separation of block copolymers in order to achieve a self-assembled partial coverage of the basic area. The lateral dimensions of the structures that are formed from the material 4 and the storage medium 6 that complementarily fills the space are typically in the nanometers range.

What is claimed is:

1. An integrated circuit having a resistive memory comprising:
   a first electrode;
   a second electrode; and
   a storage portion between the first electrode and the second electrode, the storage portion comprising a storage medium and regions made of a material different than the storage medium, the regions having dimensions smaller than a feature size that can be dimensioned with lithography used to pattern the storage medium, and the regions made from the different material comprising patterned regions of a patterned electrically insulating layer.

2. The integrated circuit as claimed in claim 1, wherein the material is surrounded by the storage medium.

3. The integrated circuit as claimed in claim 1, wherein the material is arranged directly on an interface with a carrier layer.

4. The integrated circuit as claimed in claim 3, wherein the carrier layer comprises an electrode layer.

5. The integrated circuit as claimed in claim 4, wherein an area proportion of the interface with the carrier layer of between 0.01% and 90% is covered by the storage medium.

6. The integrated circuit as claimed in claim 5, wherein an area proportion of the interface with the carrier layer of between 0.01% and 5% is covered by the storage medium.

7. The integrated circuit as claimed in claim 5, wherein an electric current flowing through the storage medium can be fed with the aid of the first and second electrodes.

8. The integrated circuit as claimed in claim 1, wherein the storage medium is electrically conductively connected to the first electrode and to the second electrode.

9. The integrated circuit as claimed in claim 1, wherein the regions made from the material comprise isolated islands having an average diameter of between 0.5 nm and 100 nm.

10. The integrated circuit as claimed in claim 1, wherein the material comprises nanocrystalline particles or an amorphous insulator.

11. The integrated circuit as claimed in claim 1, wherein the storage medium has a lower degree of crystallization in a first state and a higher degree of crystallization in a second state.

12. The integrated circuit as claimed in claim 1, wherein the storage medium contains a chalcogenide or a pnicogenide.

13. The integrated circuit as claimed in claim 1, wherein the resistive memory comprises a nonvolatile phase change memory.

* * * * *